US012582003B2

(12) United States Patent　　(10) Patent No.:　US 12,582,003 B2

Masumoto　　(45) Date of Patent:　Mar. 17, 2026

(54) SEMICONDUCTOR DEVICE AND POWER CONVERSION APPARATUS

(71) Applicant: Mitsubishi Electric Corporation, Tokyo (JP)

(72) Inventor: Hiroyuki Masumoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 735 days.

(21) Appl. No.: 18/048,348

(22) Filed: Oct. 20, 2022

(65) Prior Publication Data

US 2023/0207534 A1　　Jun. 29, 2023

(30) Foreign Application Priority Data

Dec. 23, 2021　(JP) ................................. 2021-208972

(51) Int. Cl.
H01L 25/07　　(2006.01)
H01L 23/538　　(2006.01)
(Continued)

(52) U.S. Cl.
CPC ........ H01L 25/072 (2013.01); H01L 23/5386 (2013.01); H10D 8/00 (2025.01);
(Continued)

(58) Field of Classification Search
CPC ... H01L 25/072; H01L 23/5386; H01L 24/32; H01L 2224/32225; H10D 8/00; H10D 12/411
See application file for complete search history.

(56) References Cited

U.S. PATENT DOCUMENTS

| | | | |
|---|---|---|---|
| 2011/0089558 A1 | 4/2011 | Muto et al. | |
| 2012/0241953 A1* | 9/2012 | Yamada ............. | H05K 7/20509 257/737 |
| 2013/0020694 A1* | 1/2013 | Liang ................... | H01L 23/473 257/691 |

FOREIGN PATENT DOCUMENTS

| | | |
|---|---|---|
| CN | 113140528 A | 7/2021 |
| JP | 2010-153639 A | 7/2010 |

(Continued)

OTHER PUBLICATIONS

An Office Action; "Notice of Reasons for Refusal," mailed by the Japanese Patent Office on Oct. 1, 2024, which corresponds to Japanese Patent Application No. 2021-208972 and is related to U.S. Appl. No. 18/048,348; with English language translation.

(Continued)

*Primary Examiner* — Peniel M Gumedzoe

(74) *Attorney, Agent, or Firm* — Studebaker Brackett PLLC

(57)　　ABSTRACT

A semiconductor device includes an insulating layer; a foil conductor, a circuit pattern, a plurality of semiconductor elements, a first wiring board allowing an externally input current to flow through the circuit pattern, and a wiring board connecting the plurality of semiconductor elements and allowing the current that flowed through the plurality of semiconductor elements via the circuit pattern to flow. The plurality of semiconductor elements are arranged along an extending direction of the wiring board and, in a current path passing from the wiring board through the wiring board via the circuit pattern and the plurality of semiconductor elements, the electrical resistance of the current path passing through the semiconductor element arranged on the downstream side is lower than the electrical resistance of the current path passing through the semiconductor element arranged on the upstream side.

12 Claims, 8 Drawing Sheets

(51) Int. Cl.

| | | |
|---|---|---|
| *H01L 29/739* | (2006.01) | |
| *H01L 29/861* | (2006.01) | |
| *H10D 8/00* | (2025.01) | |
| *H10D 12/00* | (2025.01) | |
| *H01L 23/00* | (2006.01) | |

(52) U.S. Cl.
CPC ............ *H10D 12/411* (2025.01); *H01L 24/32* (2013.01); *H01L 2224/32225* (2013.01)

(56)                    References Cited

FOREIGN PATENT DOCUMENTS

| JP | 2011-086889 A | 4/2011 |
|---|---|---|
| JP | 2015-018943 A | 1/2015 |

OTHER PUBLICATIONS

Office Action issued in DE 10 2022 130 276.8; mailed by the German Patent and Trademark Office on Jan. 16, 2025.

\* cited by examiner

F I G. 1
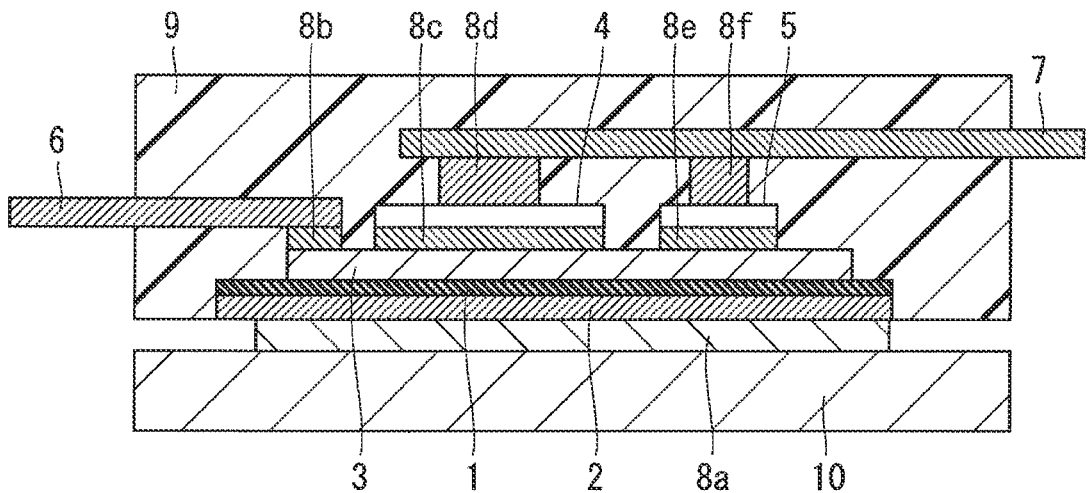

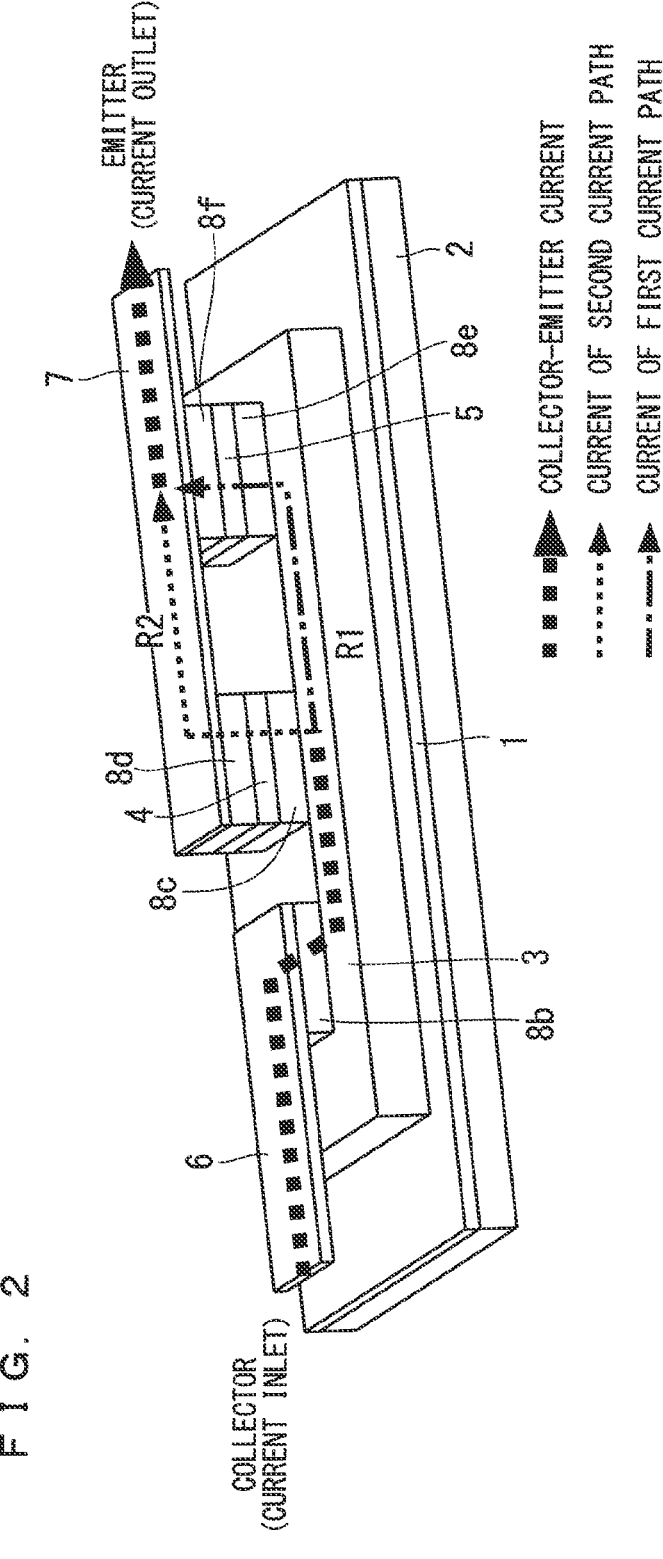
F I G. 2

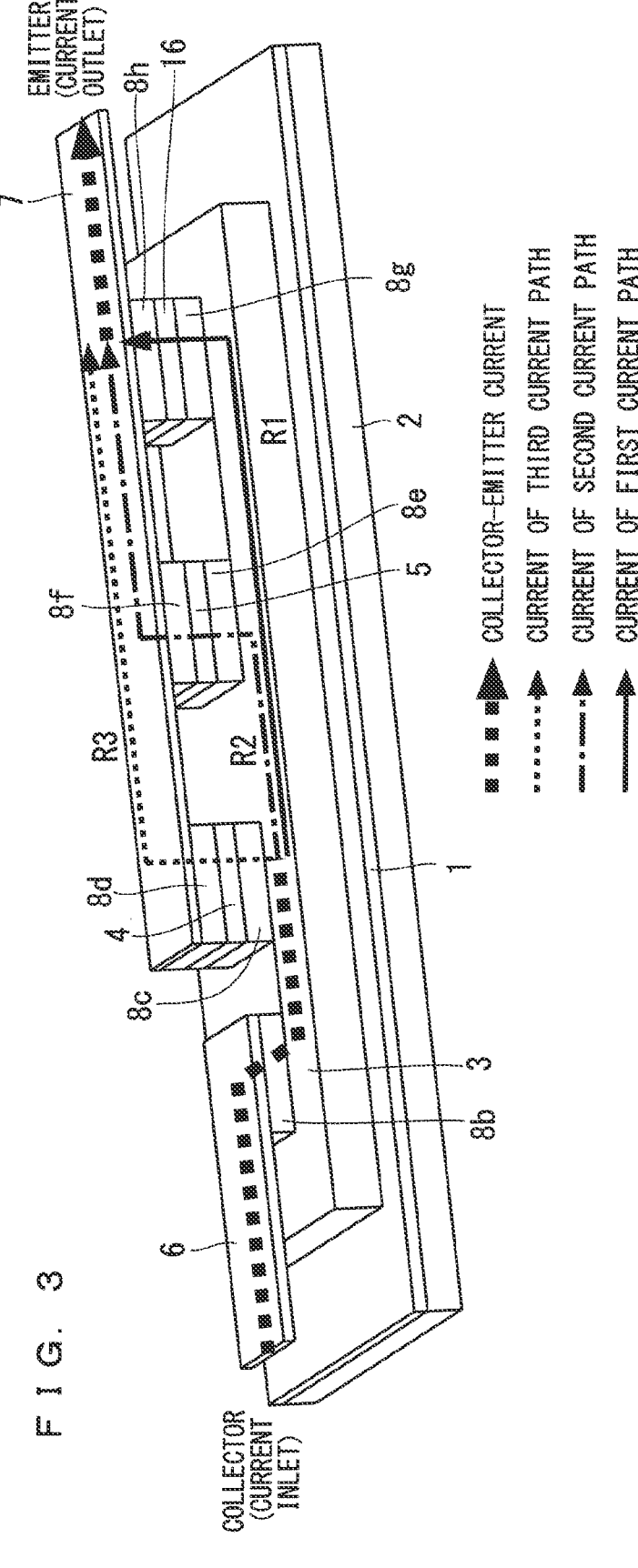
F I G. 3

F I G . 4
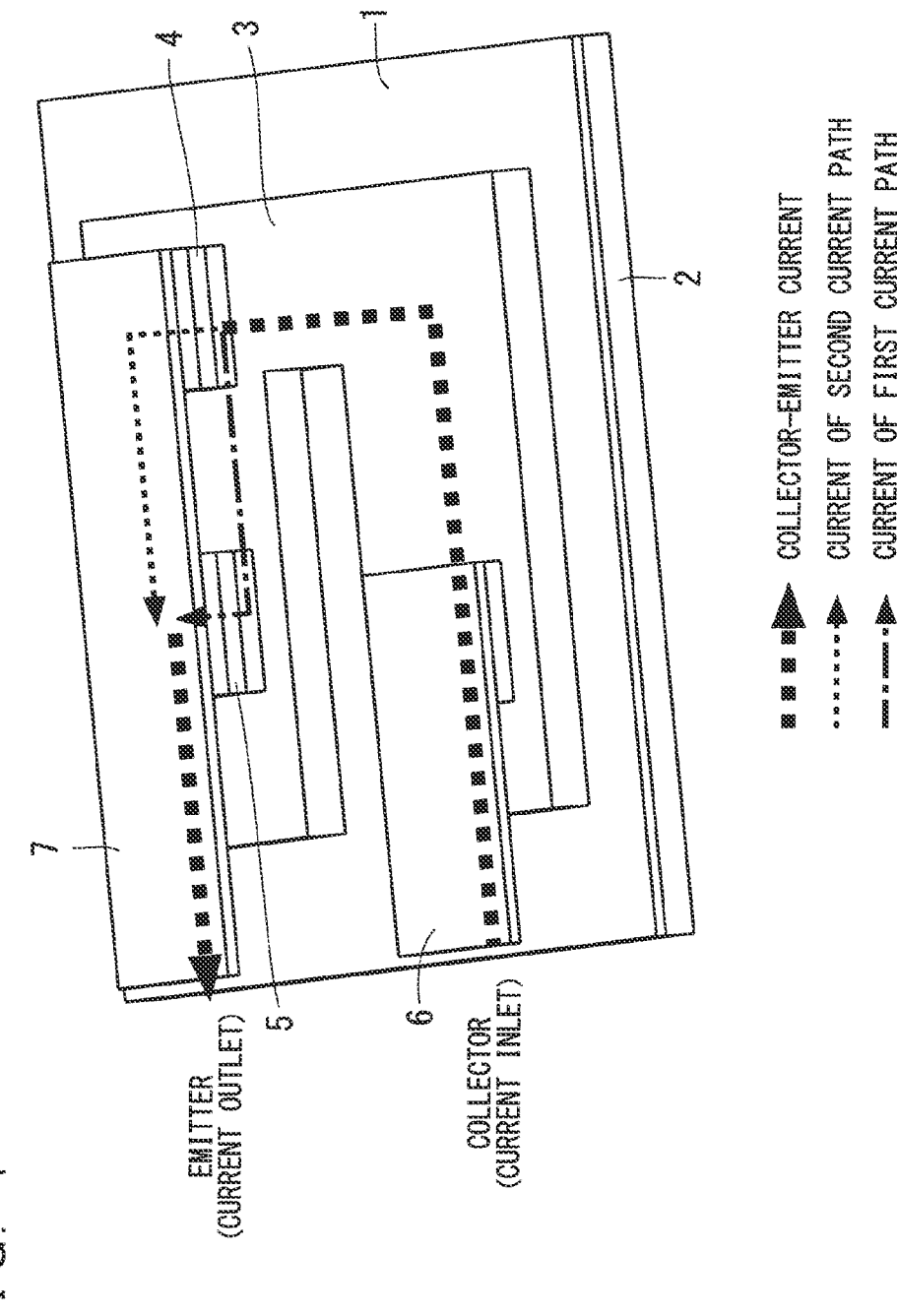
COLLECTOR-EMITTER CURRENT
CURRENT OF SECOND CURRENT PATH
CURRENT OF FIRST CURRENT PATH
EMITTER
(CURRENT OUTLET)
COLLECTOR
(CURRENT INLET)

F I G. 5
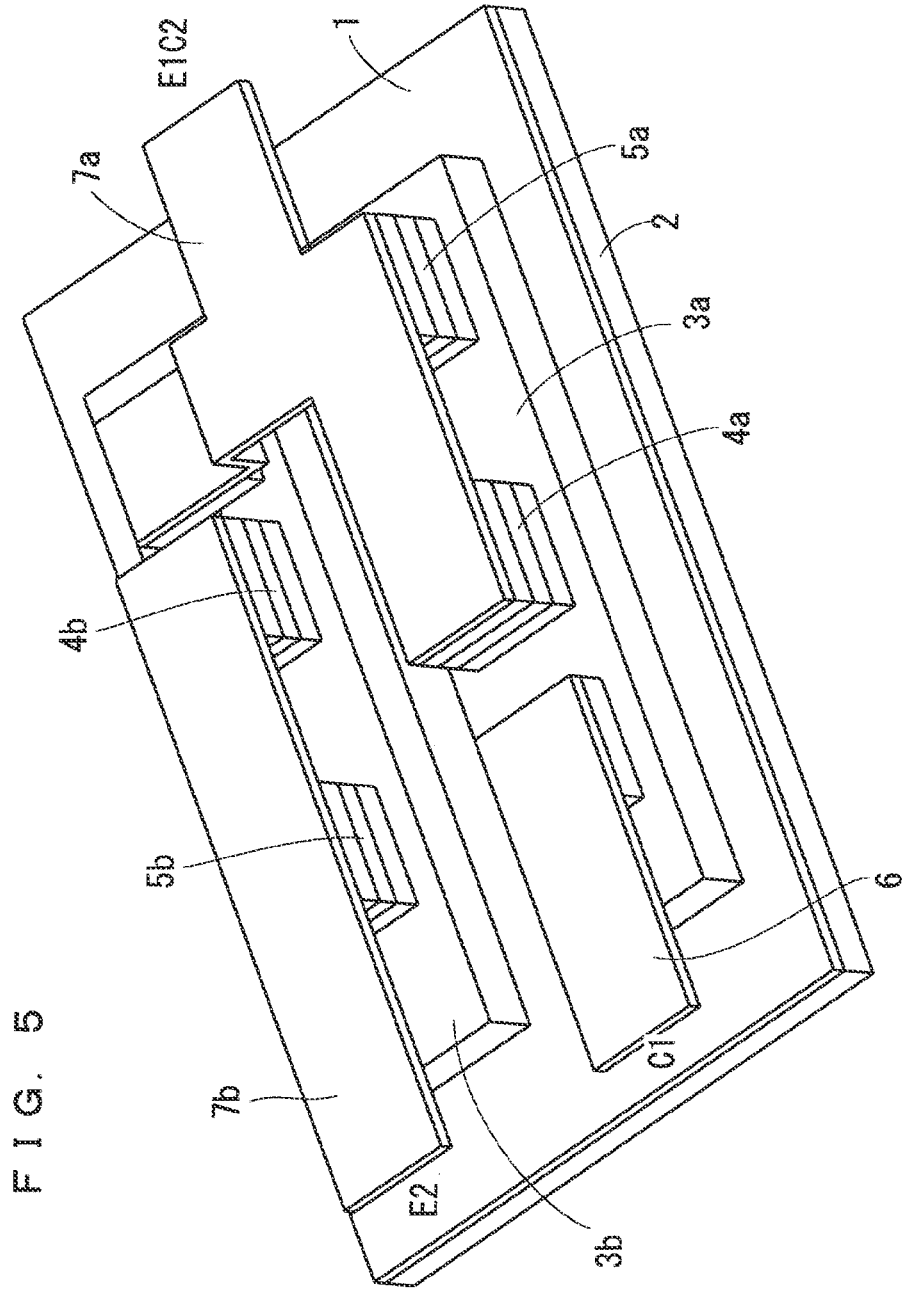

F I G. 6
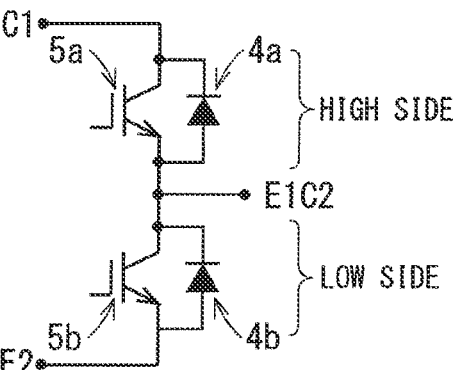

F I G .  8
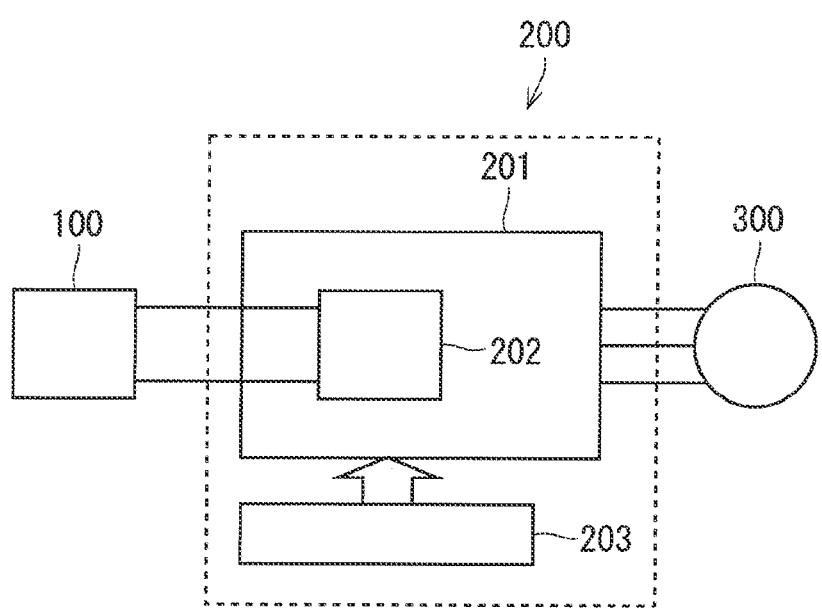

SEMICONDUCTOR DEVICE AND POWER CONVERSION APPARATUS

BACKGROUND OF THE INVENTION

Field of the Invention

The present disclosure relates to a semiconductor device and a power conversion apparatus.

Description of the Background Art

Conventionally, in semiconductor devices, the reduction in wiring inductance has been required. For example, Japanese Patent Application Laid-Open No. 2015-18943 discloses a technique in which, in a power semiconductor module including a first wiring layer that electrically contacts electrodes of a semiconductor element and a second wiring layer opposite to the first wiring layer and electrically connects to the first wiring layer, the wiring inductance is reduced by reversing the direction of the current flowing through the first wiring layer and the direction of the current flowing through the second wiring layer.

However, in the technique described in Japanese Patent Application Laid-Open No. 2015-18943, the first wiring layer and the second wiring layer are required to be opposite to each other vertically, and the degree of freedom in the layout is low, this has remained a problem of difficulty in the miniaturization of a device.

SUMMARY

An object of the present disclosure is to provide a technique ensuring both downsizing of a semiconductor device and reduction in wiring inductance.

According to the present disclosure, the semiconductor device includes an insulating layer, a foil conductor, a circuit pattern, a plurality of semiconductor elements, a first wiring board, and a second wiring board. The foil conductor is provided on the lower surface of the insulating layer. The circuit pattern is provided on the upper surface of the insulating layer. The plurality of semiconductor elements are mounted on the upper surface of the circuit pattern. The first wiring board is connected to the upper surface of the circuit pattern and allows an externally input current to flow through the circuit pattern. The second wiring board connects the plurality of semiconductor elements and allows the current that flowed through the plurality of semiconductor elements via the circuit pattern to flow. The plurality of semiconductor elements are arranged along the extending direction of the second wiring board. In a current path passing from the first wiring board through the second wiring board via the circuit pattern and the plurality of semiconductor elements, the electrical resistance of the current path passing through the semiconductor element arranged on the downstream side is lower than the electrical resistance of the current path passing through the semiconductor element arranged on the upstream side.

In the current path passing from the first wiring board through the second wiring board via the circuit pattern and the plurality of semiconductor elements, more current flows through the current path passing through the semiconductor element arranged on the downstream side, which is positioned closer to the foil conductor than the current path passing through the semiconductor element arranged on the upstream side is, so that the inductance canceling effect due to the magnetic flux formed by the foil conductor increases. This ensures to reduce the wiring inductance.

In addition, the first wiring board and the second wiring board are not required to be vertically opposite to each other, the degree of freedom in layout is secured. Therefore, both downsizing of the semiconductor device and reduction in the wiring inductance are ensured.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a cross-sectional view illustrating an example of a semiconductor device according to a first embodiment;

FIG. 2 is a perspective view illustrating the example of the semiconductor device according to the first embodiment;

FIG. 3 is a perspective view illustrating an other example of the semiconductor device according to the first embodiment;

FIG. 4 is a perspective view of the semiconductor device according to a modification example of the first embodiment;

FIG. 5 is a perspective view of a semiconductor device according to a second embodiment;

FIG. 6 is a circuit diagram of the semiconductor device according to the second embodiment;

FIG. 8 is a block diagram illustrating a configuration a power conversion system to which a power conversion apparatus according to the fourth embodiment is applied.

DESCRIPTION OF THE PREFERRED EMBODIMENTS

First Embodiment

<Configuration of Semiconductor Device>

Figure 7:
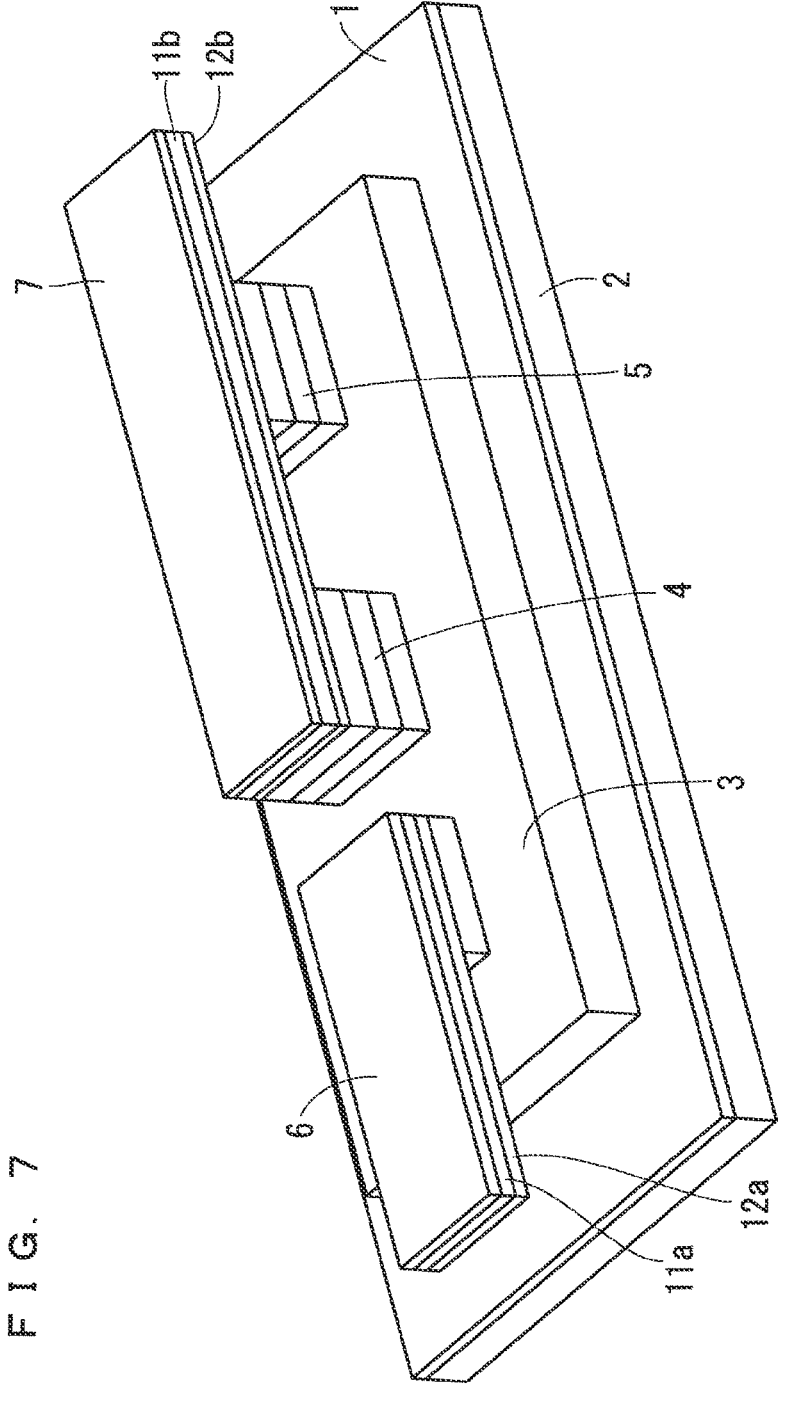
FIG. 7 is a perspective view of a semiconductor device according to a third embodiment.

The first embodiment will be described below with reference to the drawings. FIG. 1 is a cross-sectional view illustrating an example of a semiconductor device according to the first embodiment.

As illustrated in FIG. 1, the semiconductor device includes an insulating layer 1, a foil conductor 2, a circuit pattern 3, a plurality of semiconductor elements, a wiring board 6 serving as a first wiring board, a wiring board 7 serving as a second wiring board, a sealing material 9, and the cooler 10. First, an example in which a plurality of semiconductor elements are a pair of semiconductor elements 4 and 5 will be described.

The foil conductor 2 is provided on the lower surface of the insulating layer 1. The insulating layer 1 and the foil conductor 2 are formed in an elongated rectangular shape having the same size in top view. The circuit pattern 3 is composed of copper having a low conductor resistance and is provided on the upper surface of the insulating layer 1. The insulating layer 3 is smaller than the insulating layer 1 and formed in an elongated rectangular shape in top view.

The pair of semiconductor elements 4 and 5 is mounted on the upper surface of the circuit pattern 3 by being bonded by the bonding materials 8c and 8f, respectively. Further, the pair of the semiconductor elements 4 and 5 is arranged along the extending direction of the wiring board 7. The semiconductor material for the pair of semiconductor elements 4 and 5 is, for example, silicon (Si) or silicon carbide (SiC).

The wiring board 6 is bonded to the upper surface of the circuit pattern 3 with a bonding material 8*b*, and allows an externally input current to flow through the circuit pattern 3. The wiring board 7 connects the pair of semiconductor elements 4 and 5 with bonding materials 8*d* and 8*f*, respectively, and allows the current flowing through circuit pattern 3 and the pair of semiconductor elements 4 and 5 to flow. The current flowing through the wiring board 7 may or may not be output to the outside.

The sealing material 9 is an epoxy resin or the like, and seals a portion excluding the lower surface of the foil conductor 2, the insulating layer 1, the circuit pattern 3, the pair of the semiconductor elements 4 and 5, a portion excluding one end portion of the wiring board 6, and a portion excluding one end portion of the wiring board 7.

The cooler 10 is made of copper, aluminum, or the like, and is bonded to the lower surface of the foil conductor 2 with a bonding material 8*a*. The bonding materials 8*a* to 8*f* are solder, silver, or the like.

Next, the current paths of the semiconductor device will be described with reference to FIG. 2. FIG. 1 is a perspective view illustrating an example of the semiconductor device according to the first embodiment, and is a perspective view of the semiconductor device in which illustration of the sealing material 9 and the cooler 10 is omitted. In addition, illustration of the sealing material 9 and the cooler 10 is also omitted in the perspective views hereinafter.

As illustrated in FIG. 2, the current input from the wiring board 6 is output from the wiring board 7 after flowing through the pair of semiconductor elements 4 and 5 through the circuit pattern 3. In a current path passing from the wiring board 6 through the wiring board 7 via the circuit pattern 3 and the semiconductor elements 4 and 5, the electrical resistance of the current path passing through the semiconductor element 5 arranged on the downstream side is lower than the electrical resistance of the current path passing through the semiconductor element 4 arranged on the upstream side.

This will be described in detail. The current path between the pair of semiconductor elements 4 and 5 branches into two on the lower surface of semiconductor element 4. A first current path is a current path passing through the semiconductor element 5 via the circuit pattern 3 without passing through the semiconductor element 4. A second current path is a current path passing through the wiring board 7 via the semiconductor element 4.

The relationship of R1<R2 is satisfied where R1 represents the electrical resistance of the first current path and R2 represents the electrical resistance of the second current path. As a result, more current flows through the first current path located closer to the foil conductor 2 than the second current path is, so that the inductance canceling effect due to the magnetic flux formed by the foil conductor 2 increases. This ensures to reduce the wiring inductance.

There are several methods to establish the relationship R1<R2. One is to increase the thickness of the circuit pattern 3. For example, by setting the thickness of the circuit pattern 3 to 0.2 mm or more, the conductor resistance of the circuit pattern 3 reduces, making it easier to establish the relationship of R1<R2. In addition, there is a method of changing the thickness of the wiring board 7, the semiconductor element 4, or the bonding materials 8*c* and 8*d*, and a method of changing the material of the circuit pattern 3, the wiring board 7, the semiconductor element 4, or the bonding materials 8*c* and 8*d*. Further, as a method for realizing reduction in wiring inductance, in order to enhance the cancelling effect of the inductance due to the magnetic flux formed by the foil conductor 2, the thickness of the insulating layer 1 may be reduced to 0.5 mm or less, for example.

The pair of semiconductor elements 5 and 4 is an Insulated Gate Bipolar Transistor (IGBT) and a Free Wheeling Diode (FWD), respectively. The FWD is the semiconductor element 4 mounted on the upstream side of the current path between the pair of semiconductor elements 4 and 5. The IGBT is the semiconductor element 5 mounted on the downstream side of the current path between the pair of semiconductor elements 4 and 5. That is, the semiconductor element 4, which is the FWD, is arranged on the current inlet (collector terminal) side, and the semiconductor element 5, which is the IGBT, is arranged on the current outlet (emitter terminal) side. The electrical resistance of the semiconductor element 4, which is the FWD, is greater than the electrical resistance of the semiconductor element 5, which is the IGBT; therefore, the relationship of R1<R2 can be easily established.

Next, a case where the plurality of semiconductor elements are three semiconductor elements 4, 5 and 16 will be described with reference to FIG. 3. FIG. 3 is a perspective view illustrating an other example of the semiconductor device according to the first embodiment.

As illustrated in FIG. 3, the current input from the wiring board 6 is output from the wiring board 7 after flowing through the semiconductor elements 4, 5 and 16 through the circuit pattern 3. The current path between the semiconductor elements 4, 5 and 16 branches into three on the lower surface of semiconductor element 4. A first current path is a current path passing through the semiconductor element 16 via the circuit pattern 3 without passing through the semiconductor elements 4 and 5. A second current path is a current path passing through the wiring board 7 via the circuit pattern 3 and the semiconductor element 5 without passing through the semiconductor element 4. A third current path is a current path passing through the wiring board 7 via the semiconductor element 4.

The relationship of R1<R2<R3 is satisfied where R1 represents the electrical resistance of the first current path, R2 represents the electrical resistance of the second current path, and R3 represents the electrical resistance of the third current path. As a result, more current flows through the second current path located closer to the foil conductor 2 than the third current path is, moreover, more current flows through the first current path located closer to the foil conductor 2 than the second current path is, so that the inductance canceling effect due to the magnetic flux formed by the foil conductor 2 increases. This ensures to reduce the wiring inductance.

It should be noted that, although FIGS. 1 and 2 illustrate the case where the plurality of semiconductor elements are a pair of semiconductor elements 4 and 5, and FIG. 3 illustrates the case where the plurality of semiconductor elements are three semiconductor elements 4, 5, and 16, the number of semiconductor elements is not particularly limited as long as it is two or more. In this respect, the same applies to a modification example of the first embodiment and the second and third embodiments which will be described later.

Effect

As described above, the semiconductor device according to the first embodiment includes the insulating layer 1, the foil conductor 2 provided on the lower surface of the insulating layer 1, the circuit pattern 3 provided on the upper surface of the insulating layer 1, the plurality of semiconductor elements mounted on the upper surface of the circuit pattern 3, the wiring board 6 connected to the upper surface of the circuit pattern 3 and allowing an externally input current to flow through the circuit pattern 3, and the wiring board 7 connecting to the plurality of semiconductor elements and allowing the current that flowed through the plurality of semiconductor elements via the circuit pattern 3 to flow, in which, the plurality of semiconductor elements are arranged along the extending direction of the wiring board 7 and, in the current path passing from the wiring board 6 through the wiring board 7 via the circuit pattern 3 and the plurality of semiconductor elements, the electrical resistance of the current path passing through the semiconductor element arranged on the downstream side is lower than the electrical resistance of the current path passing through the semiconductor element arranged on the upstream side.

Therefore, in the current path passing from the wiring board 6 through the wiring board 7 via the circuit pattern 3 and the plurality of semiconductor elements, more current flows through the current path passing through the semiconductor element arranged on the downstream side, which is positioned closer to the foil conductor 2 than the current path passing through the semiconductor element arranged on the upstream side is, so that the inductance canceling effect due to the magnetic flux formed by the foil conductor 2 increases. This ensures to reduce the wiring inductance.

In addition, the wiring board 6 and the wiring board 7 are not required to be vertically opposite to each other, the degree of freedom in layout is secured. Therefore, both downsizing of the semiconductor device and reduction in wiring inductance are ensured.

For example, as illustrated in FIG. 2, the plurality of semiconductor elements are a pair of semiconductor elements 4 and 5, the current path between the pair of semiconductor elements 4 and 5 branches into the first current path not passing one of the semiconductor element 4 arranged on the upstream side and passing through the other one of the semiconductor element 5 arranged on the downstream side via the circuit pattern 3 and the second current path passing through the wiring board 7 via the one semiconductor element 4, and the relationship of R1<R2 is satisfied where R1 represents the electrical resistance of the first current path and R2 represents the electrical resistance of the second current path.

Accordingly, more current flows through the first current path located closer to the foil conductor 2 than the second current path is, so that the inductance canceling effect due to the magnetic flux formed by the foil conductor 2 increases. This ensures to reduce the wiring inductance.

Also, the plurality of semiconductor elements include an IGBT and an FWD, and the FWD is mounted on the upstream side of the IGBT. Accordingly, the electrical resistance of the FWD is greater than the electrical resistance of the IGBT; therefore, the above relationship of the electrical resistance of the current path passing through the semiconductor element arranged on the downstream side and the electrical resistance of the current path passing through the semiconductor element arranged on the upstream side is easily established.

In addition, the circuit pattern 3 contains copper; therefore, by using copper, which has a low conductor resistance, as the material for the circuit pattern 3, the above relationship of the electrical resistance of the current path passing through the semiconductor element arranged on the downstream side and the electrical resistance of the current path passing through the semiconductor element arranged on the upstream side is easily established.

In addition, the thickness of the circuit pattern 3 is 0.2 mm or more; therefore, by securing the thickness of the circuit pattern 3, the above relationship of the electrical resistance of the current path passing through the semiconductor element arranged on the downstream side and the electrical resistance of the current path passing through the semiconductor element arranged on the upstream side is easily established.

In addition, the thickness of the insulating layer 1 is 0.5 mm or less; therefore, by reducing the thickness of the insulating layer 1, the inductance canceling effect due to the magnetic flux formed by the foil conductor 2 increases when the current flows from the current inlet (collector terminal) to the current outlet (emitter terminal), ensuring to reduce the wiring inductance.

Further, the semiconductor material of the plurality of semiconductor elements is SiC; therefore, loss reduction in high-frequency usage range, which is an advantage of SiC, improving the life of the semiconductor device.

Modification Example of First Embodiment

Next, a modification example of the first embodiment will be described. FIG. 4 is a perspective view of a semiconductor device according to a modification example of the first embodiment.

As illustrated in FIG. 4, the insulating layer 1 and the foil conductor 2 are formed in an elongated rectangular shape having the same size in top view. The circuit pattern 3 is formed in a U shape having two linear portions in top view. The wiring board 6 and the wiring board 7 are arranged along two straight portions, respectively, and are bonded to the upper surfaces of the two straight portions. The current inlet (collector terminal) and the current outlet (emitter terminal) protrude from the same surface of the sealing material 9 (see FIG. 1), and the current path from the wiring board 6 to the wiring board 7 is U-shaped, that is, in a loop shape in top view. As a result, the leakage flux between the wiring board 6 and the wiring board 7 is reduced, ensuring to reduce the wiring inductance. It should be noted that the current path from the wiring board 6 to the wiring board 7 being U-shaped in top view contributes to the reduction of the wiring inductance; therefore, the circuit patter 3 and the wiring board 7 and the wiring board 7 are not necessarily to be formed in a U shape in top view.

Also, the plurality of semiconductor elements may include reverse conducting IGBTs. With this configuration, the number of semiconductor elements mounted on the semiconductor device is reduced, ensuring further downsizing of the semiconductor device.

The above modification example is applicable to the second and third embodiments which will be described later.

Second Embodiment

Next, a semiconductor device according to the second embodiment will be described. FIG. 5 is a perspective view of the semiconductor device according to the second embodiment. FIG. 6 is a circuit diagram of the semiconductor device according to the second embodiment. It should be noted that, in the second embodiment, the description of the same components as those described in the first embodiment will be omitted here.

As illustrated in FIGS. 5 and 6, in the second embodiment, the semiconductor device includes a plurality of (for example, two) phases composed of pairs of semiconductor elements as a plurality of semiconductor elements. Although FIGS. 5 and 6 illustrate an example having two phases, a high side and a low side, the semiconductor device may have three or more phases.

The semiconductor device includes an insulating layer 1, a foil conductor 2, circuit patterns 3a and 3b, a pair of semiconductor elements 4a and 5a, a pair of semiconductor elements 4b and 5b, a wiring board 6 as a first wiring board, wiring boards 7a and 7b as second wiring boards, a sealing material 9 (see FIG. 1), and a cooler 10 (see FIG. 1).

The foil conductor 2 is provided on the lower surface of the insulating layer 1. The insulating layer 1 and the foil conductor 2 are formed in an elongated rectangular shape having the same size in top view. The circuit patterns 3a and 3b are composed of copper having a low conductor resistance and are provided on the upper surface of the insulating layer 1. The circuit patterns 3a and 3b are smaller than the insulating layer 1 and formed in an elongated rectangular shape in top view.

The pair of semiconductor elements 4a and 5a is respectively mounted on the upper surface of the circuit pattern 3a by being bonded thereto. The pair of semiconductor elements 4b and 5b is respectively mounted on the upper surface of the circuit pattern 3b by being bonded thereto. The semiconductor material for pair of semiconductor materials 4a and 5a and the pair of semiconductor elements 4b and 5b is, for example, silicon (Si) or silicon carbide (SiC).

The wiring board 6 is bonded to the upper surface of the circuit pattern 3a and allows an externally input current to flow through the circuit pattern 3a. The wiring board 7a connects the pair of the semiconductor elements 4a and 5a and is bonded to the upper surface of the circuit pattern 3b and outputs the current flowing through the circuit pattern 3a and the pair of the semiconductor elements 4a and 5a to the outside and to the circuit pattern 3b. The wiring board 7b connects the pair of semiconductor elements 4b and 5b, and outputs the current flowing through the wiring board 7a and the pair of semiconductor elements 4b and 5b to the outside.

As for the bonding of each member, a bonding material is used as in the case of the first embodiment. One end portion of the wiring board 6 is a C1 terminal. One end portion of the wiring board 7a is an E1C2 terminal, and one end portion of the wiring board 7b is an E2 terminal.

As described above, the semiconductor device according to the second embodiment includes a plurality of phases composed of a plurality of semiconductor elements; therefore, the reduction in wiring inductance is also ensured even in the semiconductor device incorporating the plurality of phases.

Third Embodiment

Next, a semiconductor device according to a third embodiment will be described. FIG. 7 is a perspective view of the semiconductor device according to the third embodiment. It should be noted that, in the third embodiment, the description of the same components as those described in the first and second embodiments will be omitted here.

As illustrated in FIG. 7, in the third embodiment, foil conductors 12a and 12b are laminated on the lower surfaces of wiring boards 6 and 7 via insulating films 11a and 11b, respectively. As a result, the wiring boards 6 and 7 form parallel plates with the insulating films 11a and 11b vertically interposed therebetween, respectively.

As described above, in the semiconductor device according to the third embodiment, foil conductors 12a and 12b different from the foil conductor 2 are laminated on the lower surfaces of the wiring board 6 and the wiring board 7 with insulating films 11a and 11b interposed therebetween. Therefore, the inductance of wiring boards 6 and 7 is reduced; therefore, further reduction in wiring inductance is ensured.

Fourth Embodiment

In the fourth embodiment, a semiconductor device according to the above-described first to third embodiments is applied to a power conversion apparatus. Although the application of the semiconductor device according to the first to third embodiments is not limited to a specific power conversion apparatus, hereinafter, as the fourth embodiment, a case where the semiconductor device according to the first to third embodiments is applied to a three-phase inverter will be described.

FIG. 8 is a block diagram illustrating a configuration of a power conversion system to which a power conversion apparatus according to the fourth embodiment is applied.

The power conversion system illustrated in FIG. 8 includes a power supply 100, a power conversion apparatus 200, and a load 300. The power supply 100 is a DC power supply and supplies DC power to the power conversion device 200. The power supply 100 can be configured with various components, for example, the configuration thereof may include a DC system, a solar cell, and a storage battery, or include a rectifier circuit connected to an AC system or an AC/DC converter. Further, the power supply 100 may be configured by a DC/DC converter that converts the DC power output from the DC system into a predetermined power.

The power conversion apparatus 200 is a three-phase inverter connected between the power supply 100 and the load 300, which converts the DC power supplied from the power supply 100 into AC power and supplies AC power to the load 300. As illustrated in FIG. 8, the power conversion apparatus 200 includes a main conversion circuit 201 that converts DC power into AC power and outputs thereof, and a control circuit 203 that outputs a control signal for controlling the main conversion circuit 201 to the main conversion circuit 201.

The load 300 is a three-phase electric motor driven by AC power supplied from the power conversion device 200. The load 300 is not limited to a specific application, and is an electric motor mounted on various electric devices. For example, the load 300 is used as an electric motor for a hybrid vehicle, an electric vehicle, a railroad vehicle, an elevator, or an air conditioning apparatus.

Hereinafter, the detailed description is made on the power conversion device 200. The main conversion circuit 201 includes a switching element (not illustrated) and a freewheeling diode (not illustrated), and by switching the switching element, the DC power supplied from the power supply 150 is converted into AC power and supplied to the load 300. There are various specific circuit configurations of the main conversion circuit 201, and the main conversion circuit 201 according to the fourth embodiment is a two-level three-phase full bridge circuit, and has six switching elements and six freewheeling diodes each of which is anti-parallel with the respective switching elements. At least one of each switching element and each freewheeling diode of the main conversion circuit 201 is configured by a semiconductor module 202 corresponding to any one of the above-described embodiments 1 to 3. Each of the two switching elements connected in series of the six switching elements constitutes an upper and lower arm, and each upper and lower arm constitutes each phase (U phase, V phase, W phase) of the full bridge circuit. Then, the output terminal of each upper and lower arm, that is, the three output terminals of the main conversion circuit 201 are connected to the load 300.

Further, the main conversion circuit 201 includes a drive circuit (not illustrated) for driving each switching element, and the drive circuit may be built in the semiconductor module 202, or a configuration in which the drive circuit is provided separately from the semiconductor module 202 may be adoptable. The drive circuit generates a drive signal for driving the switching element of the main conversion circuit 201 and supplies the drive signal to the control electrode of the switching element of the main conversion circuit 201. Specifically, in response to the control signal from the control circuit 203 described later, a drive signal for turning on the switching element and a drive signal for turning off the switching element are output to the control electrode of each switching element. When the switching element is kept in the ON state, the drive signal is a voltage signal (ON signal) equal to or higher than a threshold voltage of the switching element, and when the switching element is kept in the OFF state, the drive signal is a voltage signal (OFF signal) equal to or lower than the threshold voltage of the switching element.

The control circuit 203 controls the switching elements of the main conversion circuit 201 so that the desired power is supplied to the load 300. Specifically, the control circuit 203 calculates the time (ON time) for each switching element of the main conversion circuit 201 to be in the ON state based on the power to be supplied to the load 300. For example, the main conversion circuit 201 is controlled by PWM control that modulates the ON time of the switching element according to the voltage to be output. Then, a control command (control signal) is output to the drive circuit provided in the main conversion circuit 201 so that an ON signal is output to the switching element supposed to be turned on at each time point and an OFF signal is output to the switching element supposed to be turned off. The drive circuit outputs an ON signal or an OFF signal as a drive signal to the control electrode of each switching element according to the control signal.

In the power conversion apparatus according to the present embodiment, the semiconductor modules according to the first to third embodiments are applied as the switching elements and the free wheel diodes of the main converter circuit 201; therefore, both downsizing and reduction in wiring inductance are ensured.

Although in the present embodiment, the semiconductor devices according to the first to third embodiments are applied to the two-level three-phase inverter has been described, the semiconductor devices according to the first to third embodiments are not limited thereto, and can be applied to various power conversion apparatuses. Although in the fourth embodiment, a two-level power conversion apparatus is adopted, a three-level or multi-level power conversion apparatus may also be adoptable, and when power is supplied to a single-phase load, the semiconductor devices according to the first to third embodiments may also be adopted to a single-phase inverter. Further, when supplying power to a DC load or the like, the semiconductor devices according to the first to third embodiments are adoptable to the DC/DC converter or the AC/DC converter.

Further, the power conversion apparatus to which any one of the semiconductor devices according to the first to third embodiments is applied is not limited to the case where the above-mentioned load is an electric motor, the power conversion apparatus can be applied to the case where a load is a power supply device for an electric discharge machine, a laser machine, an induction heating cooker, or a contactless power supply system, further applied to the case where a load is a power conditioner for a solar power generation system and a power storage systems, for example.

The embodiments can be combined, appropriately modified or omitted.

While the disclosure has been illustrated and described in detail, the foregoing description is in all aspects illustrative and not restrictive. It is therefore understood that numerous modifications and variations can be devised without departing from the scope of the invention.

What is claimed is:

1. A semiconductor device comprising:
   an insulating layer,
   a foil conductor provided on a lower surface of the insulating layer;
   a circuit pattern provided on an upper surface of the insulating layer;
   a plurality of semiconductor elements mounted on an upper surface of the circuit pattern;
   a first wiring board that is a collector terminal connected on the upper surface of the circuit pattern and allowing an externally input current to flow through the circuit pattern, and
   a second wiring board that is an emitter terminal connecting the plurality of semiconductor elements and allowing the current that flowed through the plurality of semiconductor elements via the circuit pattern to flow, wherein
   the plurality of semiconductor elements are arranged along an extending direction of the second wiring board, and,
   in a current path passing from the first wiring board through the second wiring board via the circuit pattern and the plurality of semiconductor elements, electrical resistance of the current path passing through one of the semiconductor elements arranged on a downstream side closer to the emitter terminal than to the collector terminal is lower than electrical resistance of the current path passing through an other one of the semiconductor elements arranged on an upstream side closer to the collector terminal than to the emitter terminal.

2. The semiconductor device according to claim 1, wherein
   the plurality of semiconductor elements are a pair of the semiconductor elements,
   the current path between the pair of semiconductor elements branches into a first current path not passing through the one of the semiconductor elements and passing through the other one of the semiconductor elements via the circuit pattern and a second current path passing through the second wiring board via the one of the semiconductor elements, and
   a relationship of R1<R2 is satisfied where R1 represents the electrical resistance of the first current path and R2 represents the electrical resistance of the second current path.

3. The semiconductor device according to claim 1, wherein
   the current path from the first wiring board to the second wiring board is U-shaped in top view.

4. The semiconductor device according to claim 1, wherein the plurality of semiconductor elements include an IGBT and an FWD, and the FWD is mounted on the upstream side of the IGBT.

5. The semiconductor device according to claim 1, further comprising a plurality of phases composed of the plurality of semiconductor elements.

6. The semiconductor device according to claim 1, wherein the circuit pattern contains copper.

7. The semiconductor device according to claim 1, wherein a thickness of the circuit pattern is 0.2 mm or more.

8. The semiconductor device according to claim 1, wherein a thickness of the insulating layer is 0.5 mm or less.

9. The semiconductor device according to claim 1, wherein, on the first wiring board and the second wiring board, foil conductors being different from the foil conductor are laminated on lower surfaces thereof via insulating films, respectively.

10. The semiconductor device according to claim 1, wherein the plurality of semiconductor elements include a reverse conducting IGBT.

11. The semiconductor device according to claim 1, wherein a semiconductor material of the plurality of semiconductor elements is SiC.

12. A power conversion apparatus comprising:

a main conversion circuit including the semiconductor device according to claim 1, and configured to convert and output input power; and a control circuit configured to output a control signal for controlling the main conversion circuit to the main conversion circuit.

* * * * *